United States Patent
Fang et al.

(10) Patent No.: US 8,977,988 B2
(45) Date of Patent: Mar. 10, 2015

(54) METHOD OF OPTICAL PROXIMITY CORRECTION FOR MODIFYING LINE PATTERNS AND INTEGRATED CIRCUITS WITH LINE PATTERNS MODIFIED BY THE SAME

(71) Applicant: United Microelectronics Corp., Hsin-Chu (TW)

(72) Inventors: Kuan-Wen Fang, Tainan (TW); Chin-Lung Lin, Hsinchu (TW); Kuo-Chang Tien, Tainan (TW); Yi-Hsiu Lee, Chiayi County (TW); Chien-Hsiung Wang, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/859,718

(22) Filed: Apr. 9, 2013

(65) Prior Publication Data

US 2014/0304666 A1    Oct. 9, 2014

(51) Int. Cl.
 *G06F 17/50* (2006.01)
 *G06K 9/00* (2006.01)

(52) U.S. Cl.
 CPC .................................. *G06F 17/5068* (2013.01)
 USPC ................ 716/53; 716/55; 382/144; 382/145

(58) Field of Classification Search
 USPC ................................. 716/53, 55; 382/144–145
 See application file for complete search history.

(56) References Cited

U.S. PATENT DOCUMENTS

| | | | |
|---|---|---|---|
| 6,033,811 A | 3/2000 | Lee | |
| 6,395,438 B1 | 5/2002 | Bruce | |
| 6,470,489 B1 | 10/2002 | Chang | |
| 6,546,540 B1 * | 4/2003 | Igarashi et al. | 716/118 |
| 6,576,486 B2 | 6/2003 | Lin | |
| 6,684,382 B2 | 1/2004 | Liu | |
| 6,753,115 B2 | 6/2004 | Zhang | |
| 6,763,514 B2 | 7/2004 | Zhang | |
| 6,852,453 B2 | 2/2005 | Wu | |
| 6,961,920 B2 | 11/2005 | Zach | |
| 7,266,801 B2 | 9/2007 | Kotani | |
| 7,386,829 B2 | 6/2008 | Lee | |
| 7,434,195 B2 * | 10/2008 | Hsu et al. | 716/52 |
| 7,617,475 B2 | 11/2009 | Lin | |
| 7,624,369 B2 | 11/2009 | Graur | |
| 7,669,153 B2 * | 2/2010 | Wu et al. | 716/55 |
| 7,784,019 B1 * | 8/2010 | Zach | 716/53 |
| 8,065,652 B1 * | 11/2011 | Salowe et al. | 716/139 |
| 8,201,110 B1 * | 6/2012 | Gu et al. | 716/53 |
| 8,386,969 B2 * | 2/2013 | Hsu et al. | 716/54 |
| 8,627,242 B1 * | 1/2014 | Kuo et al. | 716/53 |
| 2005/0081167 A1 * | 4/2005 | Kever et al. | 716/2 |
| 2006/0066339 A1 | 3/2006 | Rajski | |
| 2006/0080633 A1 * | 4/2006 | Hsu et al. | 716/19 |
| 2006/0085772 A1 | 4/2006 | Zhang | |
| 2006/0088772 A1 * | 4/2006 | Zhang | 430/5 |

(Continued)

*Primary Examiner* — Stacy Whitmore
(74) *Attorney, Agent, or Firm* — Winston Hsu; Scott Margo

(57) ABSTRACT

A method of optical proximity correction executed by a computer system and integrated circuit layout formed by the same, the step of optical proximity correction comprises: providing an integrated circuit layout with a plurality of parallel line patterns, wherein one side of at least one line pattern is provided with a convex portion; and modifying the integrated circuit layout by forming a concave portion corresponding to the convex portion at the other side of the line pattern.

11 Claims, 2 Drawing Sheets

(56) References Cited

U.S. PATENT DOCUMENTS

| | | |
|---|---|---|
| 2006/0161452 A1 | 7/2006 | Hess |
| 2007/0011638 A1* | 1/2007 | Watanabe et al. ............... 716/10 |
| 2008/0256504 A1* | 10/2008 | Oishi et al. ...................... 716/19 |
| 2008/0270969 A1* | 10/2008 | Wu et al. ......................... 716/19 |
| 2009/0193385 A1 | 7/2009 | Yang |
| 2009/0271759 A1* | 10/2009 | Torres Robles et al. ........ 716/19 |
| 2009/0278569 A1 | 11/2009 | Taoka |
| 2009/0300576 A1 | 12/2009 | Huang |
| 2010/0036644 A1 | 2/2010 | Yang |
| 2010/0070944 A1 | 3/2010 | Wu |
| 2010/0086862 A1 | 4/2010 | Yang |
| 2010/0115765 A1* | 5/2010 | Hamamoto ..................... 29/825 |
| 2010/0131914 A1 | 5/2010 | Wu |
| 2010/0175041 A1 | 7/2010 | Krasnoperova |
| 2011/0029939 A1 | 2/2011 | Yang |
| 2011/0294263 A1 | 12/2011 | Ogawa |
| 2012/0185807 A1* | 7/2012 | Tsai et al. ....................... 716/52 |
| 2013/0086541 A1* | 4/2013 | Luo et al. ...................... 716/112 |
| 2013/0207198 A1* | 8/2013 | Becker et al. ................. 257/369 |

* cited by examiner

METHOD OF OPTICAL PROXIMITY CORRECTION FOR MODIFYING LINE PATTERNS AND INTEGRATED CIRCUITS WITH LINE PATTERNS MODIFIED BY THE SAME

BACKGROUND OF THE INVENTION

1. Field of the Invention

The present invention relates generally to a method of optical proximity correction (OPC), and more particularly, to a method of optical proximity correction capable of improving the coverage of inter-connect patterns stacked on line patterns.

2. Description of the Prior Art

In the fabrication of semiconductors, semiconductor devices are connected by multiple interconnect layers at different levels. Interlayer connections of various conductive layers are achieved by interconnection means such as vias or contacts. Accordingly, in the design of integrated circuit (IC) layout for each level, it is essential to consider the interconnect relation and the layout alignment of upper and lower levels as well as the limitations induced by process capability. However, as the scale of integration for nowadays electronic devices continues to shrink, the critical dimension (CD) required for semiconductor devices becomes smaller. In this condition, it is quite difficult to design layouts having necessary critical dimensions for every component while still maintaining a precise alignment of the layouts and reliable interconnections between the conductive layers.

SUMMARY OF THE INVENTION

To meet the demand of reliable interconnections for nowadays semiconductor devices, a method of optical proximity correction is provided in the present invention which may modify the original layout pattern, such as a line pattern, to achieve a precise alignment of the interconnect structures between upper and lower layers while still maintaining the critical dimension uniformity (CDU) of the device pattern and providing a sufficient process window, ex. a PR window.

One object of the present invention is to provide a method of optical proximity correction executed by a computer system comprising the steps of providing an integrated circuit layout with a plurality of parallel line patterns, wherein one side of at least one line pattern is provided with a convex portion, and modifying the integrated circuit layout by forming a concave portion corresponding to the convex portion at the other side of the line pattern with convex portion.

Another object of the present invention is to provide a method of optical proximity correction executed by a computer system, comprising the steps of providing an integrated circuit layout with a plurality of parallel line patterns, and modifying the integrated circuit layout by forming a convex portion and a corresponding concave portion respectively at both sides of the line pattern where an interconnect pattern of another integrated circuit layout is stacked thereon, such that the interconnect pattern is completely stacked on the line pattern.

Still another object of the present invention is to provide an integrated circuit layout comprising a plurality of line patterns, at least one line pattern is provided with a convex portion and a corresponding concave portion, wherein the portions of line pattern in front of and behind the convex portion and the concave portion are straight lines and have an identical critical dimension; and an interconnect pattern stacked on the line pattern between the convex portion and the concave portion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
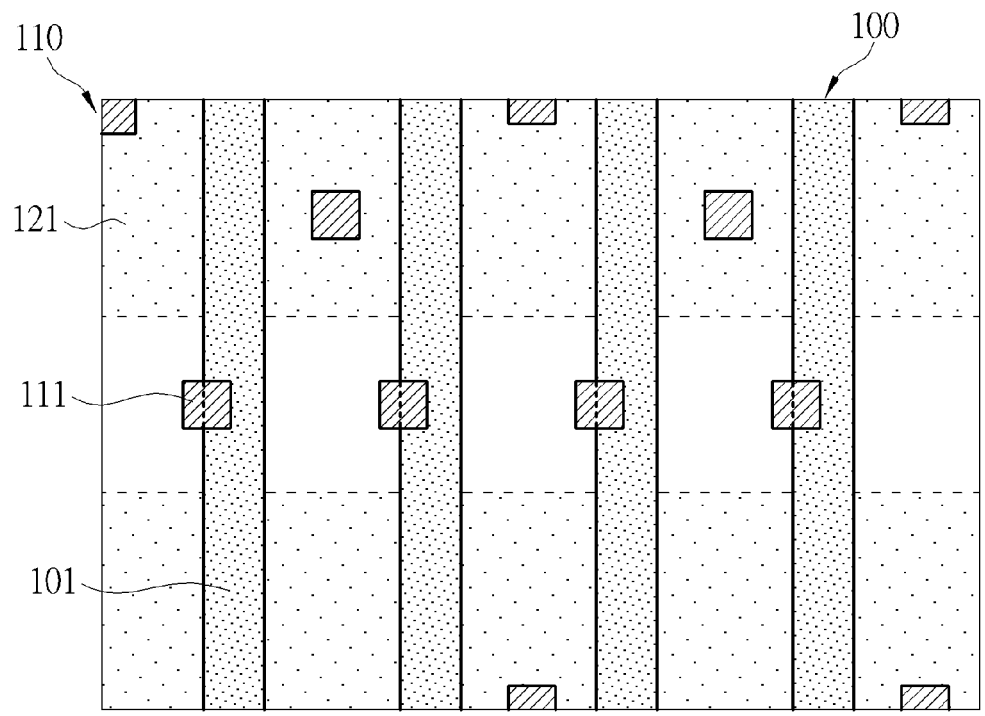
FIG. 1 is a top view schematically illustrating the deviation condition between upper interconnect patterns and lower line patterns.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown byway of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Please refer to FIG. 1, which schematically illustrates the deviation between an upper interconnect pattern and a lower interconnect pattern. Two stacked integrated circuit (IC) layouts are shown in FIG. 1, wherein one is a lower layout 100 denoted by dot patterns, and the other is an upper layout 110 denoted by hatched patterns. The lower layout 100 includes a plurality of parallel line patterns 101. The upper layout 110 includes a plurality of interconnect patterns 111. In real processes, the lower layout 100 and upper layout 110 may be pre-designed photomask patterns involved in hundreds of photolithographic steps of semiconductor process flow. The layout 100 and 110 may be stored in a computer readable medium and to be used in the fabrication of photomask. The photomask with layout 100 or 110 can be used in dozen of to hundreds of photolithographic processes to form photoresist with predetermined patterns. The photoresist may then be used in etch processes as an etch mask to form patterned semiconductor structures. For example, the line pattern 101 of layout 100 may be used to form poly-Si lines or metal lines which may serve as a gate structure. The interconnect pattern 111 may be used to form contacts or vias which connect an upper layer and a lower layer. Additionally, active regions 121 are shown in FIG. 1 to serve as the source/drain of the semiconductor devices, wherein a number of interconnect patterns 111 are stacked on line patterns 101, and a number of interconnect patterns 111 are stacked on the active regions 121.

With regard to process requirement and alignment deviation, some design rules allow the interconnect pattern to exceed the extent of underlying line pattern, as shown in FIG. 1. In this scheme, the interconnect pattern 111 is not completed stacked on the line pattern 101. A slight alignment deviation exists therebetween. This kind of overhung interconnect feature is usually observed in layout schemes with extreme small critical dimension (CD), in which the upper and lower layouts can't be precisely aligned. Although this kind of incomplete stack is allowed by the design rule, there are trade-offs in the performance of the resulting semiconductor devices. For example, an incomplete stacking may induce leakage problems and worse process windows.

Figure 2:
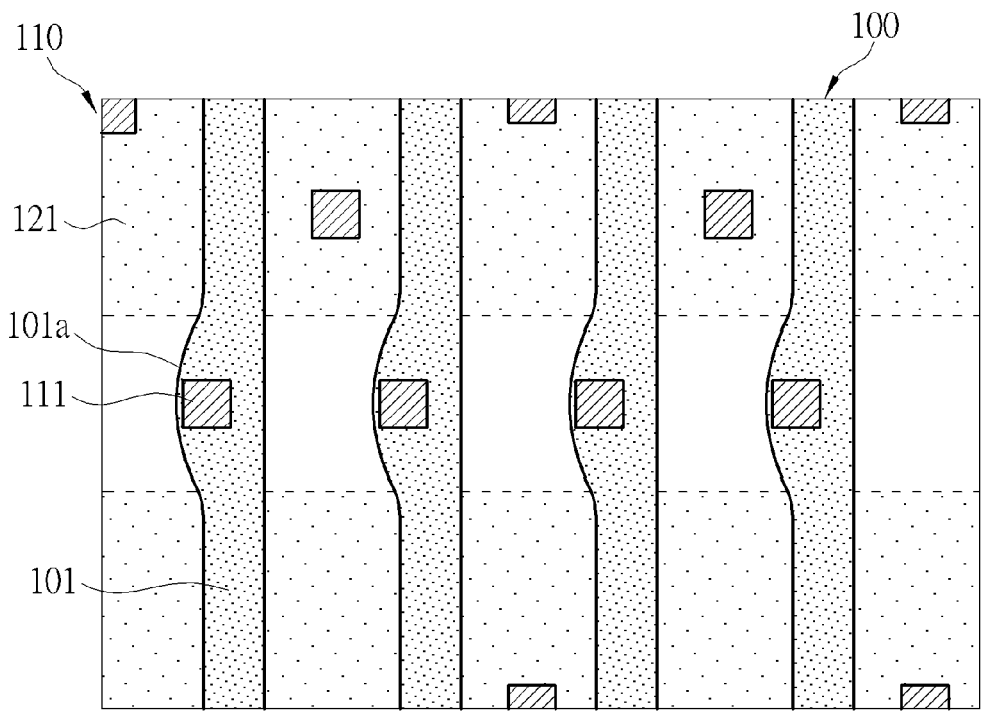
FIGS. 2-3 are top views schematically illustrating the steps of the optical proximity correction method in accordance with one preferred embodiment of the present invention.

Please refer to FIG. 2. Since a deviation may inevitably occurs between the stacked interconnect pattern 111 and the line pattern 101, the solution of present invention is to modify the original line pattern 101 through optical proximity correction (OPC) without changing relative positions of original interconnect patterns, to form a convex portion 101a at one side of the line pattern 101 where the interconnect pattern 111 deviates. For example, in the first preferred embodiment shown in FIG. 2, the convex portion 101a is a smooth and arched line segment. The extent and curvature of the convex portion 101a is determined by the critical dimension and the deviation value of the interconnect pattern 111. The line pattern 101 with the convex portion 101a should cover the entire interconnect pattern 111, so that the interconnect pattern 111 may be completely stacked on the line pattern 101. The above-mentioned OPC method may be executed by a computer system, for example, by an OPC software which process the information of layout stored in the computer readable medium according some specific algorithms to modify the patterns.

Even though the problems of incomplete stacking and alignment may be solved by the above-mentioned approach of forming convex portions 101a, other problems may successively occur. For example, since the local critical dimension of the convex portion 101a is larger than the original critical dimension of the line pattern 101, the critical dimension uniformity (CDU) of the line patterns 101 may decrease. Furthermore, since the line pattern 101 with convex portion 101a is no longer a regular straight line, it is prone to induce hot spots in the photoresist formed by the line patterns, thereby lowering the process window of the photolithographic process. Besides, when the spacing between the line patterns 101 is small, the convex portion 101a is prone to short the nearest line pattern 101.

Figure 3:
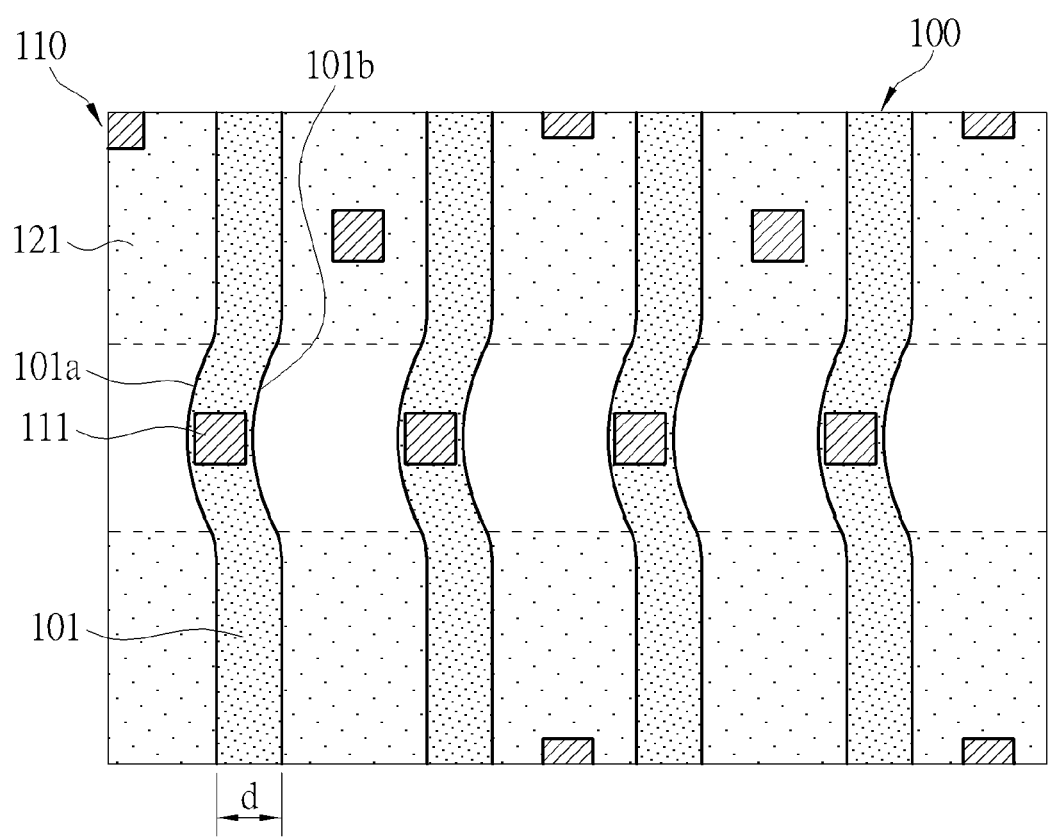

To resolve the above-mentioned problem, please refer to FIG. 3, a second preferred embodiment is further provided in present invention. In this embodiment, line pattern 101 is modified again by optical proximity correction to form a concave portion 101b corresponding to each convex portion 101a at the other side of the line pattern 101, without changing relative positions of original interconnect patterns 111. The convex portion 101a and concave portion 101b are smooth and arched line segments. The extent and curvature of the concave portion 101b is determined by the critical dimension and the deviation value of the interconnect pattern 111, such that the line pattern 101 between the convex portion 101a and the concave portion 101b covers the entire interconnect pattern 111. In this way, the interconnect pattern 111 may be completely stacked on the line pattern 101. Please note that the OPC method of present invention is not limited in the condition that the interconnect pattern is stacked on the line pattern. The method of present invention is also adapted in the condition that the line pattern is stacked on the interconnect pattern.

The advantages of OPC method of the present invention is: by modifying the original straight line pattern into a line pattern with convex portions and corresponding concave portions correlative to the deviation value of the interconnect pattern, the incomplete stacking and misalignment of integrated circuit layouts may be easily solved, while still maintaining the default CD and process window of the line pattern.

According to the above-disclosed OPC method, please refer again to FIG. 3, an integrated circuit layout formed by the same is therefore provided in the present invention, which comprises a plurality of line patterns 101. Each line pattern is provided with a convex portion 101a and a corresponding concave portion 101b, wherein the portions of line pattern 101 in front of and behind the convex portion 101a and the concave portion 101b are straight lines and have an identical critical dimension d. An interconnect pattern is stacked on the line pattern 101 between the convex portion 101a and the concave portion 101b.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of optical proximity correction executed by a computer system, comprising the steps of:
    providing an integrated circuit layout with a plurality of parallel line patterns and a plurality of interconnect patterns disposed corresponding to said parallel line patterns, wherein one side of each one of said parallel line patterns has a convex portion so that said convex portion overlaps a corresponding one of said interconnect patterns; and
    using the computer system to modify said integrated circuit layout by forming a concave portion based on a position of said interconnect pattern, wherein a position of the concave portion is corresponding to said convex portion at the other side of said line pattern with said convex portion.

2. A method of optical proximity correction executed by a computer system according to claim 1, further comprising:
    stacking the interconnect pattern on said line pattern between said convex portion and said concave portion.

3. The method of optical proximity correction executed by a computer system according to claim 1, wherein said corresponding concave portion is formed based on a critical dimension uniformity of said parallel line patterns.

4. The method of optical proximity correction executed by a computer system according to claim 3, wherein said critical dimension uniformity of said parallel line patterns is maintained during said step of forming the concave portion.

5. A method of optical proximity correction executed by a computer system, comprising the steps of:
    providing an integrated circuit layout with a plurality of parallel line patterns; and
    using the computer system to modify said integrated circuit layout by sequentially forming a convex portion and a corresponding concave portion respectively at both sides of said line pattern based on a position of said interconnect pattern where an interconnect pattern of another integrated circuit layout is stacked thereon, such that said interconnect pattern is completely stacked on said line pattern.

6. A method of optical proximity correction executed by a computer system according to claim 5, further comprising:
    performing said step of modifying said integrated circuit layout when the position of said interconnect pattern is deviated from said line pattern.

7. The method of optical proximity correction executed by a computer system according to claim 5, wherein said corresponding concave portion is formed based on a critical dimension uniformity of said parallel line patterns.

8. The method of optical proximity correction executed by a computer system according to claim 7, wherein said critical dimension uniformity of said parallel line patterns is maintained during said step of forming the concave portion.

9. An integrated circuit comprising an integrated circuit layout, wherein said integrated circuit layout comprises:
    a plurality of line patterns, wherein at least one said line pattern has a convex portion and a corresponding concave portion, wherein portions of said line pattern in front of and behind said convex portion and said concave portion are straight lines and have an identical critical dimension; and
    an interconnect pattern stacked on said line pattern between said convex portion and said concave portion.

10. An integrated circuit according to claim 9, wherein said line pattern is a poly-Si line pattern.

11. An integrated circuit according to claim 9, wherein said interconnect pattern is a via pattern or a contact pattern.

* * * * *